United States Patent
Hatakeyama et al.

(10) Patent No.: US 7,378,899 B2
(45) Date of Patent: May 27, 2008

(54) SEMICONDUCTOR INTEGRATED CIRCUIT

(75) Inventors: Kaori Hatakeyama, Shiga (JP); Masaya Sumita, Hyogo (JP); Keisuke Kishishita, Kyoto (JP); Michio Numa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/540,751

(22) Filed: Oct. 2, 2006

(65) Prior Publication Data
US 2007/0024344 A1 Feb. 1, 2007

Related U.S. Application Data

(62) Division of application No. 10/921,290, filed on Aug. 19, 2004, now Pat. No. 7,123,076.

(30) Foreign Application Priority Data

Aug. 20, 2003 (JP) ............... 2003-296247

(51) Int. Cl.
G05F 1/10 (2006.01)
(52) U.S. Cl. .................................. 327/534
(58) Field of Classification Search ................ 327/530, 327/534, 535, 537, 538, 540, 543
See application file for complete search history.

(56) References Cited

U.S. PATENT DOCUMENTS 5,157,279 A 10/1992 Lee
6,366,141 B1 * 4/2002 Chiba et al. ................. 327/108
6,404,243 B1 6/2002 Koch et al.
6,469,568 B2 10/2002 Toyoyama et al.
6,515,534 B2 2/2003 Dabral
6,518,825 B2 2/2003 Miyazaki et al.
6,552,596 B2 4/2003 Cowles et al.
6,559,708 B2 * 5/2003 Notani .......................... 327/537
6,653,890 B2 11/2003 Ono et al.
6,943,613 B2 * 9/2005 Miyazaki et al. ............ 327/534
7,176,745 B2 * 2/2007 Itoh et al. .................... 327/534

FOREIGN PATENT DOCUMENTS

JP 2001-186007 A 7/2001

* cited by examiner

Primary Examiner—Jeffrey S Zweizig
(74) Attorney, Agent, or Firm—McDermott Will & Emery LLP

(57) ABSTRACT

A semiconductor integrated circuit according to the present invention comprises a circuit as a controlled object including an MOS transistor, wherein a control potential (at least one of a substrate potential and source potential) is to be controlled, a control signal generation circuit for generating a control signal with respect to the control potential based on an internal signal of the circuit as the controlled object, and a control potential control circuit for controlling the control potential (substrate potential/source potential) of the MOS transistor based on the control signal.

8 Claims, 9 Drawing Sheets

F I G. 1 0
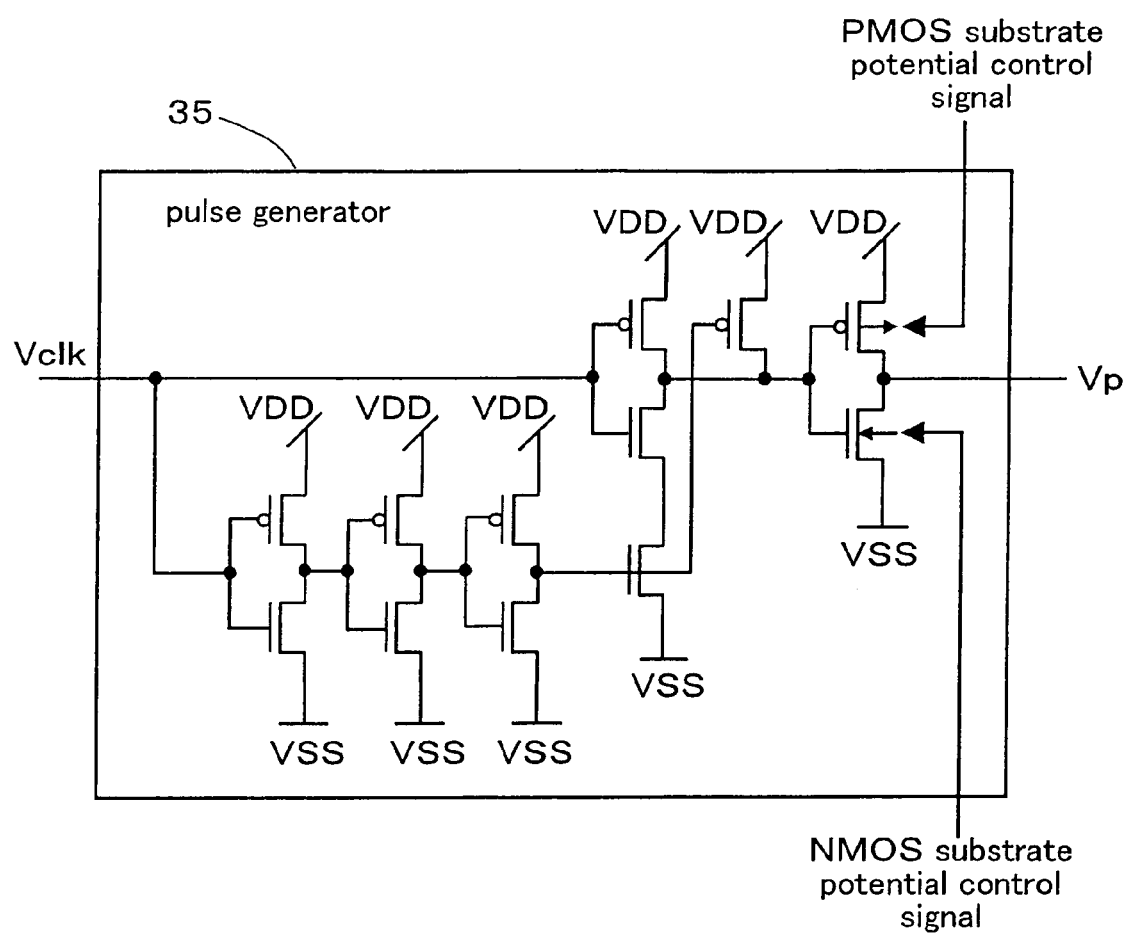

SEMICONDUCTOR INTEGRATED CIRCUIT

RELATED APPLICATIONS

This application is a divisional of application Ser. No. 10/921,290, filed Aug. 19, 2004, now U.S. Pat. No. 7,123,076, which claims priority of Japanese Patent application No. 2003-296247, filed Aug. 20, 2003, the contents of which are herewith incorporated by reference.

BACKGROUND OF THE INVENTION

1. Field of the Invention

The present invention relates to a semiconductor integrated circuit including an MOS transistor, in particular to a technology for realizing a higher speed and reduced power consumption by controlling a control potential (substrate potential or source potential) of the MOS transistor.

2. Description of the Related Art

A large-scale semiconductor integrated circuit in recent years enjoys a higher operation speed resulting from a higher integration thereof, while consuming a larger amount of electricity. When a power-supply voltage is reduced, power consumption can be accordingly reduced. However, the reduction of the power-supply voltage leads to a reduction of a current flow required for operating an MOS transistor, which interferes with the accelerated operation. A method for avoiding the inconvenience is to reduce an absolute value of a threshold voltage of the transistor in compliance with the reduction of the power-supply voltage, however the reduction of the absolute value of the threshold voltage results in a large volume of a leakage current flow of the transistor.

A possible solution to deal with such a problem is to connect a semiconductor substrate to a gate terminal when the transistor is in active mode and connect the same to a terminal of a substrate voltage smaller than a gate voltage when the transistor is on standby to thereby control the leakage current flow.

In the foregoing method, when a voltage for turning off the transistor, which is currently in the active mode, is applied to the gate, the same voltage is also applied to the semiconductor substrate. In such a situation, it is impossible to satisfactorily control the leakage current flow.

BRIEF SUMMARY OF THE INVENTION

1) A semiconductor integrated circuit according to one embodiment of the present invention comprises:

a circuit as a controlled object including a plurality of MOS transistors, wherein a control potential of at least one MOS transistor of the plurality of MOS transistors is to be controlled;

a control signal generation circuit, the control signal generation circuit generating a control signal for controlling the control potential based on an internal signal of the circuit as the controlled object; and a control potential control circuit, the control potential control circuit controlling the control potential of the at least one MOS transistor in the circuit as the controlled object based on the control signal.

According to the foregoing configuration, the control potential of the MOS transistor (at least one of substrate potential and source potential) is controlled to thereby control an absolute value of a threshold voltage of the MOS transistor. When the control potential is controlled in such manner that the absolute value of the threshold voltage becomes larger, a leakage current flowing when the MOS transistor is turned off can be reduced. Further, resistance to a glitch noise due to an influence from crosstalk can be increased, and when the control potential is controlled in such manner as to obtain the small absolute value of the threshold voltage, an operation can be accelerated.

2) A semiconductor integrated circuit according to one embodiment of the present invention comprises:

a circuit as a controlled object including a plurality of MOS transistors, wherein a substrate potential of at least one MOS transistor of the plurality of MOS transistors is to be controlled;

a control signal generation circuit for substrate potential, the control signal generation circuit for substrate potential generating a control signal for controlling the substrate potential based on an internal signal of the circuit as the controlled object; and a substrate potential control circuit, the substrate potential control circuit controlling the substrate potential of the at least one MOS transistor in the circuit as the controlled object based on the control signal.

According to the foregoing configuration, the substrate potential of the MOS transistor is controlled to thereby control the absolute value of the threshold voltage of the MOS transistor. When a back bias voltage (voltage applied in such a direction as to make it difficult for the transistor to be turned on) is supplied to the substrate potential, the absolute value of the threshold voltage becomes larger. As a result, the leakage current flowing when the MOS transistor is turned off can be reduced. Further, the resistance to the glitch noise due to the influence from the crosstalk can be increased, and the absolute value of the threshold voltage can be reduced by supplying a forward bias voltage (voltage applied in such a direction as to make it easy for the transistor to be turned on) to the substrate potential. As a result, the operation of with a higher speed can be achieved.

3) A semiconductor integrated circuit according to one embodiment of the present invention comprises:

a circuit as a controlled object including a plurality of MOS transistors, wherein a source potential of at least one MOS transistor of the plurality of MOS transistors is to be controlled;

a control signal generation circuit for source potential, the control signal generation circuit for source potential generating a control signal for controlling the source potential based on an internal signal of the circuit as the controlled object; and a source potential control circuit, the source potential control circuit controlling the source potential of the at least one MOS transistor in the circuit as the controlled object based on the control signal.

According to the foregoing configuration, in the case of the MOS transistor constituting a PMOS transistor, the operation of the MOS transistor can be accelerated when the source potential is set to be higher than a normal voltage. Further, resistance to a variation of the power-supply voltage due to IR drop, or the like, can be increased, and the setting of the source potential to be lower than the normal voltage can reduce a gate leakage current flow. Another advantage is that, because the electricity is proportional to the square of the power-supply voltage, the source potential, which is set to be low, realizes lower power consumption.

4) A semiconductor integrated circuit according to one embodiment of the present invention, which corresponds to the combination of the foregoing configurations 2) and 3), comprises:

a circuit as a controlled object including a plurality of MOS transistors, wherein a substrate potential is to be controlled, a source potential of at least one MOS transistor of the plurality of MOS transistors is to be controlled, a control signal generation circuit for substrate potential, the control signal generation circuit for substrate potential generating a control signal for controlling the substrate potential based on an internal signal of the circuit as the controlled object;

a control signal generation circuit for source potential, the control signal generation circuit for source potential generating a control signal for controlling the source potential based on the internal signal of the circuit as the controlled object;

a substrate potential control circuit, the substrate potential control circuit controlling the substrate potential of the at least one MOS transistor in the circuit as the controlled object based on the control signal for the substrate potential; and a source potential control circuit, the source potential control circuit controlling the source potential of the at least one MOS transistor in the circuit as the controlled object based on the control signal for the source potential.

The foregoing configuration further promotes the reduction of the power consumption and the operation at a higher speed.

According to the semiconductor integrated circuit as described in 2) or 4), it is preferable, in the configuration of the substrate potential control circuit, to set a plurality of candidates for selection composed of at least two potentials to be supplied to the substrate potential control circuit to thereby select a potential from the plurality of candidates based on the control signal for the substrate potential and supply the selected potential to a substrate of the MOS transistor as the controlled object.

According to the foregoing configuration, the control with a more precision can be achieved by selecting a potential from the plurality of candidates for the substrate potential of the MOS transistor.

Further, according to the semiconductor integrated circuit as described in 3) or 4), it is preferable, in the configuration of the source potential control circuit, to set a plurality of candidates for selection composed of at least two potentials to be supplied to the source potential control circuit to thereby select a potential from the plurality of candidates based on the control signal for the source potential and supply the selected potential to a source of the MOS transistor as the controlled object.

According to the foregoing configuration, the control with a more precision can be achieved by selecting a potential from the plurality of candidates for the source potential of the MOS transistor.

Further, according to the semiconductor integrated circuit as described in 2) or 4), in the case in which two types of transistors, an PMOS transistor and NMOS transistor, are included in the MOS transistor as the controlled object, it is preferable for the configuration of the substrate potential control circuit to be comprised of a PMOS substrate potential control circuit for controlling a substrate potential of the PMOS transistor and an NMOS substrate potential control circuit for controlling a substrate potential of the NMOS transistor.

According to the foregoing configuration, the PMOS transistor and NMOS transistor can be separately controlled, thereby achieving an intensified effect for the control of the substrate potential.

Further, according to the semiconductor integrated circuit as described in 3) or 4), in the case in which two types of transistors, an PMOS transistor and NMOS transistor, are included in the MOS transistor as the controlled object, it is preferable for the configuration of the source potential control circuit to be comprised of a PMOS source potential control circuit for controlling a source potential of the PMOS transistor and an NMOS source potential control circuit for controlling a source potential of the NMOS transistor.

According to the foregoing configuration, the PMOS transistor and NMOS transistor can be separately controlled, thereby achieving an intensified effect for the control of the source potential.

In the case in which there is a plurality of MOS transistors as the controlled object, and those transistors are logically identical to one another and adjacently positioned to one another, it is preferable for a substrate potential control circuit to collectively control the substrate potentials of the plurality of MOS transistors. Also, it is preferable for a source potential control circuit to collectively control the source potentials of the plurality of MOS transistors. In the foregoing case, a wiring length can be shortened, and the power consumption is thereby further reduced.

A functional element and a poststage functional element, which are connected to a clock tree, are generally logically related to each other in respective operations, and are positioned in a neighborhood. Therefore, it is preferable to collectively control the substrate potentials of the MOS transistors included in a plurality of functional elements by means of a substrate potential control circuit, and to collectively control the source potentials of the MOS transistors included in the plurality of functional elements by means of a source potential control circuit. In the foregoing case, the wiring length can be shortened, and the substrate potential or source potential can be thereby effectively controlled.

When the semiconductor integrated circuit is divided into a plurality of areas and a plurality of MOS transistors included in one of the areas logically operate in a same manner, it is preferable for the plurality of transistors operating in the same manner to be collectively controlled by a substrate potential control circuit or a source potential control circuit. In the case of being connected to other than the clock tree, the wiring length can be shortened, and the substrate potential or source potential can be thereby effectively controlled.

Additional objects and advantages of the present invention will be apparent from the following detailed description of preferred embodiments thereof, which are best understood with reference to the accompanying drawings.

BRIEF DESCRIPTION OF THE DRAWINGS

FIG. 10 is a circuit diagram illustrating an example of a specific configuration of the pulse generator according to the present invention.

In all these figures, like components are indicated by the same numerals

DETAILED DESCRIPTION OF THE PREFERRED EMBODIMENTS

Figure 1:
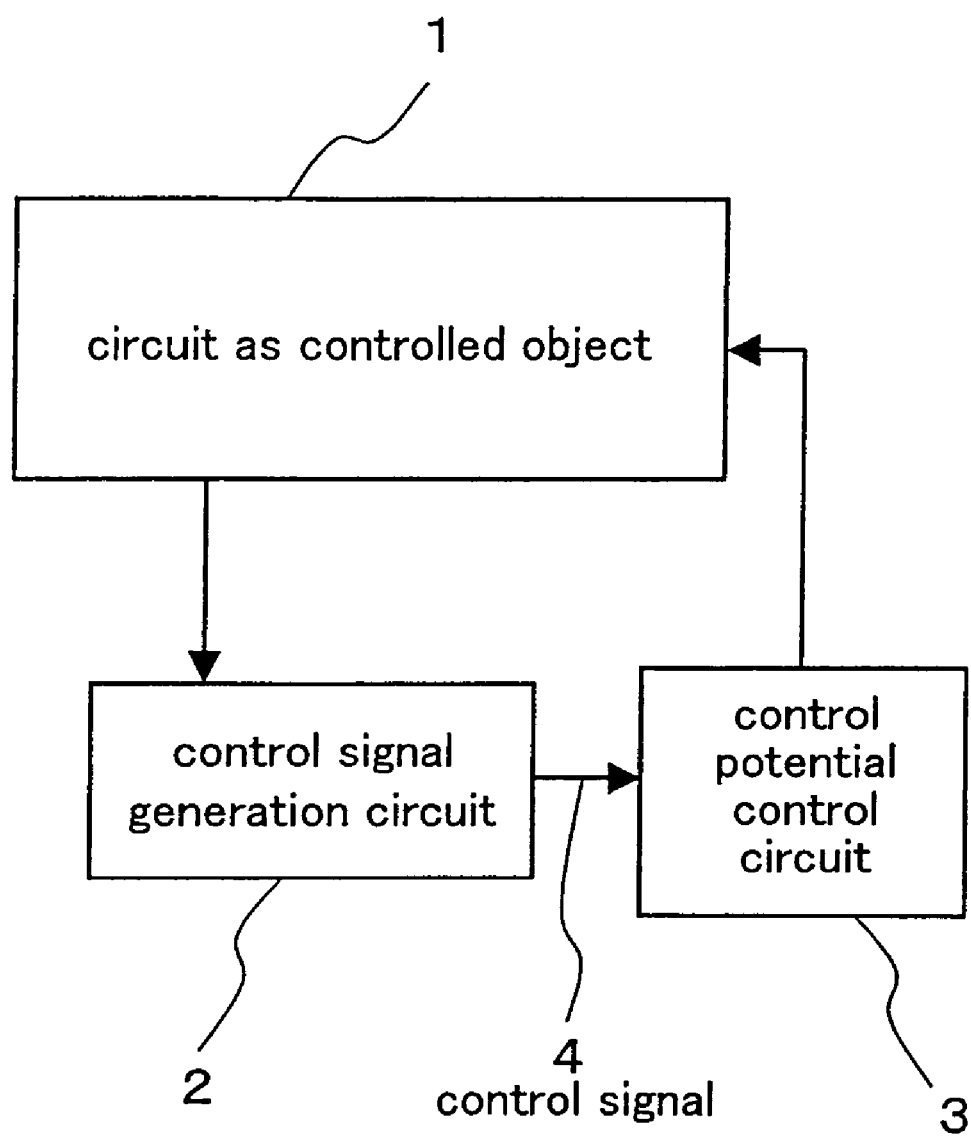
FIG. 1 is a block diagram illustrating a configuration of a semiconductor integrated circuit according to an embodiment of the present invention.

Hereinafter, embodiments of a semiconductor integrated circuit according to the present invention are described referring to the drawings.

First, a basic embodiment of the present invention is described referring to FIG. 1. In FIG. 1, a reference numeral 1 denotes a circuit as a controlled object including a plurality of MOS transistors, wherein a control potential of at least one MOS transistor of the plurality of MOS transistors (at least one of substrate potential and source potential) is to be controlled. A reference numeral 2 denotes a control signal generation circuit. A reference numeral 3 denotes a control potential control circuit, and a reference numeral 4 denotes a control signal.

The circuit as the controlled object is comprised of a plurality of logic elements such as a flip-flop, inverter, AND circuit, in which a signal is propagated to thereby realize a certain logic. Therefore, the circuit as the controlled object differs to such a memory cell array as a SRAM (Static Random Access Memory) or DRAM (Dynamic Random Access Memory) The control signal generation circuit 2 generates a control signal 4 for controlling the control potential control circuit 3 based on an internal signal inputted from the circuit as the controlled object 1. The control potential control circuit 3 controls a control potential (substrate potential/source potential) of the MOS transistor included in the circuit as the controlled object 1 and an absolute value of a threshold voltage of the MOS transistor based on the control signal 4. When the absolute value of the threshold voltage is controlled in such a manner as to produce a large value, a leakage current flowing when the MOS transistor is turned off can be reduced. Further, resistance to a glitch noise due to an influence from crosstalk can be increased. When the absolute value of the threshold voltage is controlled in such a manner as to produce a small value, an operation speed can be accelerated.

Next, a more specific embodiment is described.

Figure 2:
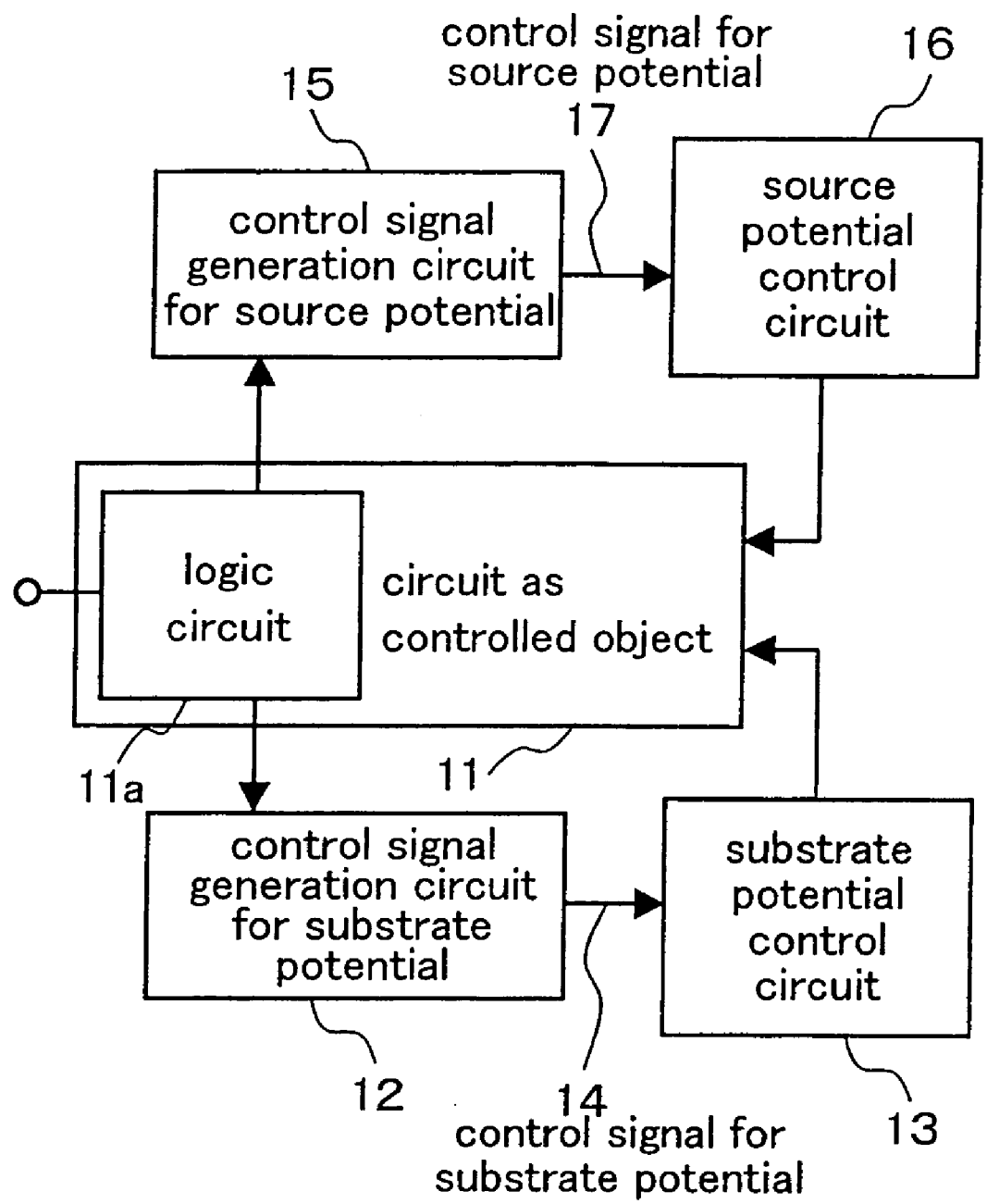
FIG. 2 is a block diagram illustrating a configuration of a semiconductor integrated circuit according to an embodiment of the present invention.

A configuration of a semiconductor integrated circuit according to the present embodiment is described referring to FIG. 2. In FIG. 2, a reference numeral 11 denotes a circuit as a controlled object including an MOS transistor, wherein a substrate potential and a source potential are to be controlled. A reference numeral 11a denotes a logic circuit including the MOS transistor in the circuit as the controlled object 11. A reference numeral 12 denotes a control signal generation circuit for substrate potential. A reference numeral 13 denotes a substrate potential control circuit. A reference numeral 14 denotes a substrate potential control signal. A reference numeral 15 denotes a control signal generation circuit for source potential. A reference numeral 16 denotes a source potential control circuit. A reference numeral 17 denotes a source potential control signal.

The control signal generation circuit for substrate potential 12 generates the substrate potential control signal 14 for controlling the substrate potential control circuit 13 based on an internal signal inputted from the logic circuit 11a. The substrate potential control circuit 13 controls a substrate potential of the MOS transistor included in the circuit as the controlled object 11 based on the substrate potential control signal 14.

In the foregoing state, when a back bias voltage is applied to the substrate potential of the MOS transistor, the absolute value of the threshold voltage becomes larger. As a result, a leakage current flowing when the MOS transistor is turned off can be reduced. Further, the resistance to the glitch noise due to the influence from the crosstalk can be increased.

On the contrary, when a forward bias voltage is applied to the substrate potential, the absolute value of the threshold voltage becomes small. As a result, the operation can be accelerated.

In the same manner, the control signal generation circuit for source potential 15 generates the source potential control signal 17 for controlling the source potential control circuit 16 based on the internal signal inputted from the logic circuit 11a. The source potential control circuit 16 controls a source potential of the MOS transistor included in the circuit as the controlled object 11 based on the source potential control signal 17.

In the foregoing state, in the case of the MOS transistor constituting a PMOS transistor, when the source potential is set to be higher than a normal voltage, the operation of the MOS transistor can achieve a higher speed. Further, resistance to a variation of a power-supply voltage due to IR drop, or the like, can be increased. Also, when the source potential is set to be lower than normal, a gate leakage current flow can be reduced. Another advantage is that, because the electricity is proportional to the square of the power-supply voltage, the source potential, which is set to be low, realizes lower power consumption.

The substrate and source potentials of the MOS transistor may be simultaneously controlled. More specifically, when the source potential is reduced in compliance with a frequency in order to reduce the power consumption, the back bias is applied to the substrate in response to the reduction, as a result of which the absolute value of the threshold voltage is increased. This prevents the noise resistance from decreasing due to the reduced source potential. In this manner, the circuit achieving the low power consumption and strong noise resistance can be realized.

Figure 3:
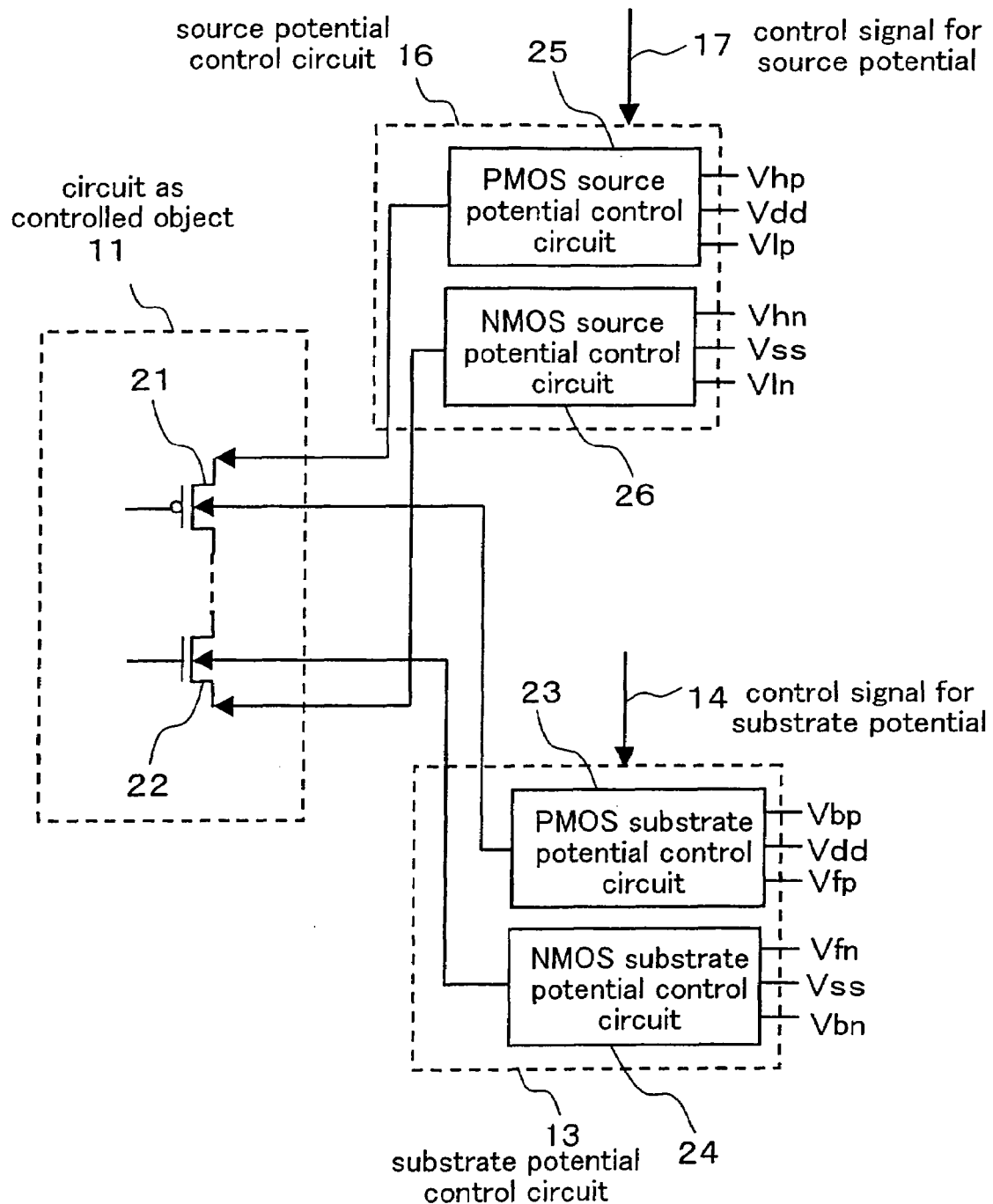
FIG. 3 is a block circuit diagram illustrating a specific example of a circuit as a controlled object, substrate potential control circuit and source potential control circuit of a semiconductor integrated circuit according to the embodiment of the present invention.

Next, FIG. 3 shows a case, in which the circuit as the controlled object 11 is comprised of the PMOS transistor and NMOS transistor. In FIG. 3, a reference numeral 21 denotes the PMOS transistor included in the circuit as the controlled object 11, and a reference numeral 22 denotes the NMOS transistor included in the circuit as the controlled object 11.

The substrate potential control circuit 13 is comprised of a PMOS substrate potential control circuit 23 for controlling a substrate potential of the PMOS transistor and an NMOS substrate potential control circuit 24 for controlling a substrate potential of the NMOS transistor. The substrate potential control circuit 13 separately controls the substrate potential of the PMOS transistor 21 and the substrate potential of the NMOS transistor 22.

The source potential control circuit 16 is comprised of a PMOS source potential control circuit 25 for controlling a source potential of the PMOS transistor and an NMOS source potential control circuit 26 for controlling a source potential of the NMOS transistor. The source potential control circuit 16 separately controls the source potential of the PMOS transistor 21 and the source potential of the NMOS transistor 22.

To the PMOS substrate potential control circuit 23 are supplied a PMOS normal potential Vdd, a PMOS back bias potential Vbp (>Vdd) and a PMOS forward bias potential Vfp (<Vdd). Based on a value of the substrate potential control signal 14, one of the foregoing three voltage values is selected to be applied to a semiconductor substrate of the PMOS transistor 21.

To the NMOS substrate potential control circuit 24 are supplied an NMOS normal potential Vss, an NMOS back bias potential Vbn (<Vss) and an NMOS forward bias potential Vfn (>Vss). Based on the value of the substrate potential control signal 14, one of the foregoing three voltage values is selected to be applied to a semiconductor substrate of the NMOS transistor 22.

In the same manner, to the PMOS source potential control circuit 25 are supplied the PMOS normal potential Vdd, a PMOS high potential Vhp (>Vdd) and a PMOS low potential Vlp (<Vdd). Based on a value of the source potential control signal 17, one of the foregoing three voltage values is selected to be applied to a source terminal of the PMOS transistor 21.

To the NMOS source potential control circuit 26 are supplied the NMOS normal potential Vss, an NMOS high potential Vhn (>Vss) and an NMOS low potential Vln (<Vss). Based on the value of the source potential control signal 17, one of the foregoing three voltage values is selected to be applied to a source terminal of the NMOS transistor 22.

Figure 4:
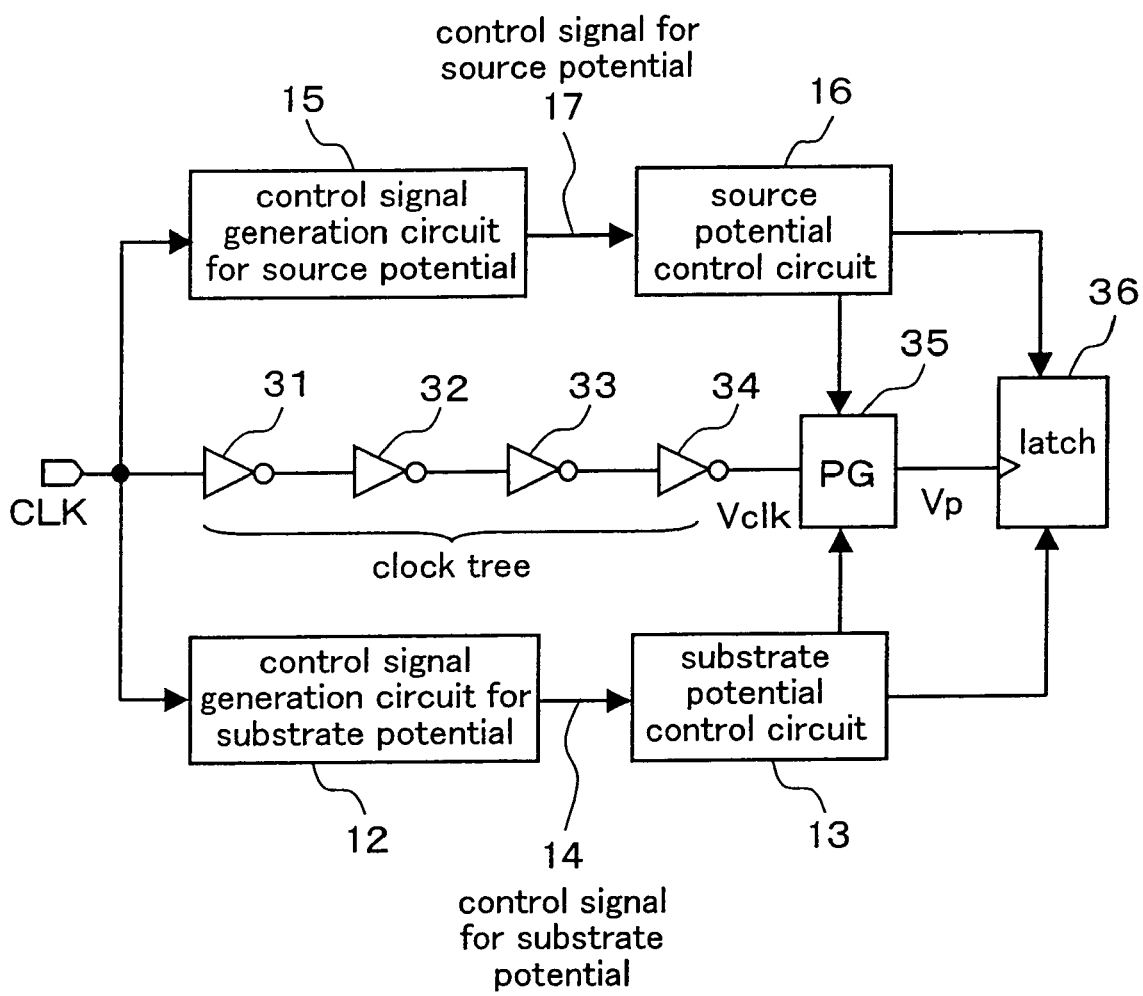
FIG. 4 is a block circuit diagram of a semiconductor integrated circuit, wherein a circuit as a controlled object is comprised of a pulse generator and a latch, according to the embodiment of the present invention.
Figure 11:
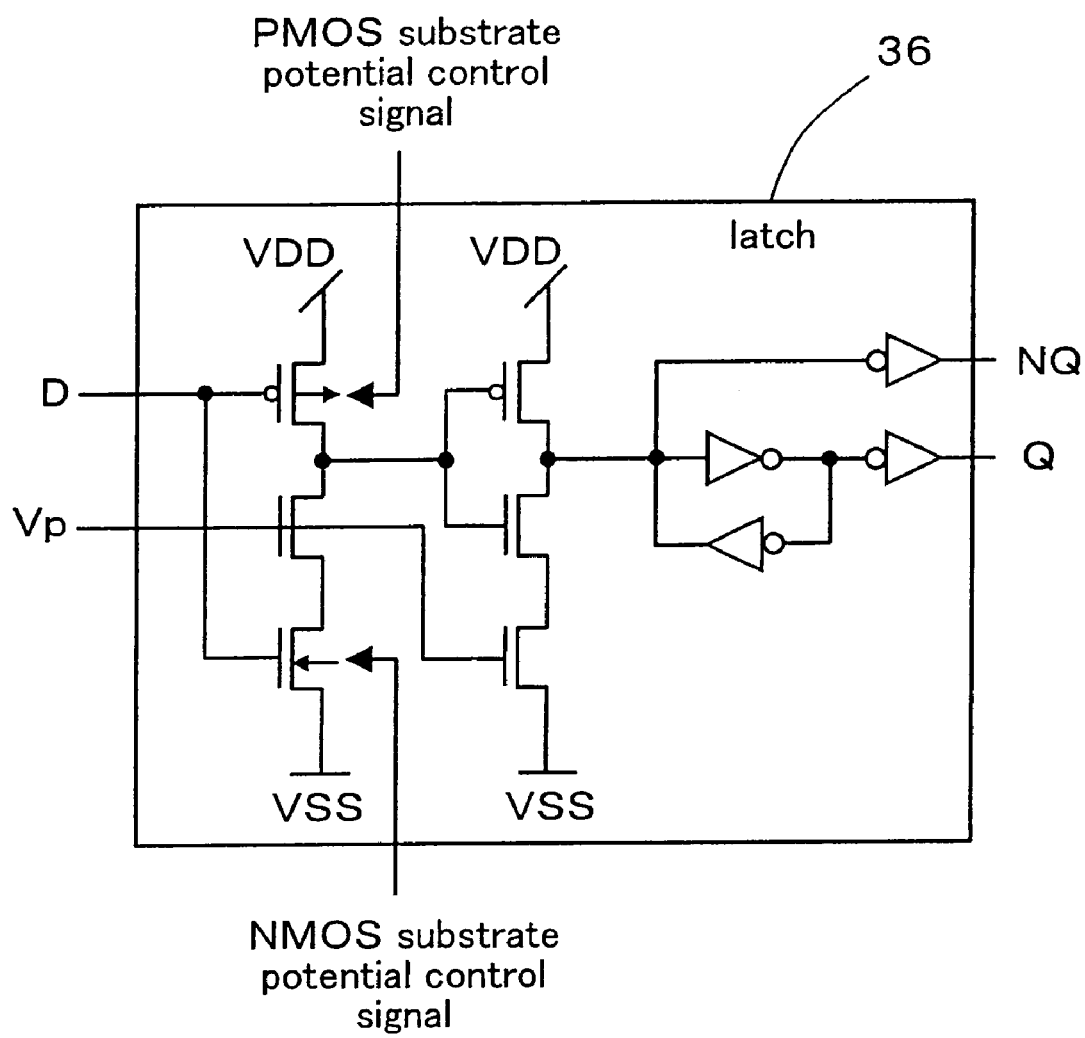
FIG. 11 is a circuit diagram illustrating an example of a specific configuration of the latch according to the present invention.

Next, referring to FIG. 4 is described an example of applying the substrate potential control and source potential control as described above to a circuit, wherein a clock tree, pulse generator and latch are used. In FIG. 4, reference numerals 31, 32, 33, and 34 each denotes an inverter forming the clock tree. A reference numeral 35 denotes a pulse generator for generating a pulse waveform from a clock signal, and a reference numeral 36 denotes a latch. A substrate potential of a transistor included in the pulse generator 35 and a substrate potential of a transistor included in the latch 36 are controlled by means of the control signal generation circuit for substrate potential 12 and substrate potential control circuit 13. In the same manner, respective source potentials thereof are controlled by means of the control signal generation circuit for source potential 15 and source potential control circuit 16. FIGS. 10 and 11 respectively show a circuit diagram of a pulse generator in general and a circuit diagram of a latch in general.

Figure 5:
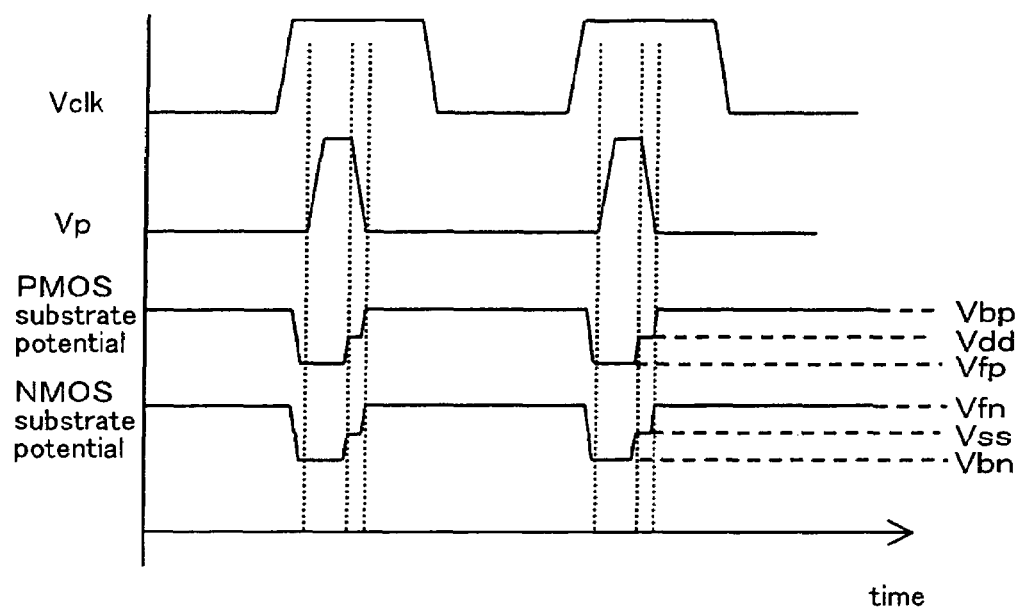
FIG. 5 is a waveform chart illustrating the case of implementing a substrate potential control by means of the pulse generator according to the embodiment of the present invention.

First is described an example of implementing the substrate potential control with respect to the circuit shown in FIG. 4. FIG. 5 shows a waveform chart in the case of controlling a substrate potential of a transistor linked to a final stage of the pulse generator 35, in which an example of a clock waveform, an output pulse waveform, a substrate potential waveform of the PMOS transistor, and a substrate potential waveform of the NMOS transistor are shown.

According to the example, when a pulse rises, the PMOS forward bias voltage Vfp is supplied to the substrate potential of the PMOS transistor, and the back bias voltage Vbn is supplied to the substrate potential of the NMOS transistor. This reduces the absolute value of the threshold voltage of the PMOS transistor, thereby making it easy for the PMOS transistor to be turned on, while the absolute value of the threshold voltage of the NMOS transistor is increased, thereby making it difficult for the NMOS transistor to be turned on. In consequence of the foregoing process, the pulse can rise more promptly.

In contrast to that, when the pulse falls, a pulse width is maintained. Therefore, the PMOS normal potential Vdd is supplied to the substrate potential of the PMOS transistor, and the NMOS normal potential Vss is supplied to the substrate potential of the NMOS transistor.

During the period when the pulse is low, the back bias voltage Vbp is supplied to the PMOS transistor, and the forward bias voltage Vfn is supplied to the NMOS transistor. This increases the absolute value of the threshold voltage of the PMOS transistor, thereby reducing the leakage current flow of the PMOS transistor. Further, the noise resistance can be increased.

In the described manner, three kinds of potentials are subject to selection to be supplied to the substrate as the substrate potential of the transistor to thereby, while maintaining the pulse waveforms, configure the pulse generator featuring a high speed and low power consumption.

Figure 6:
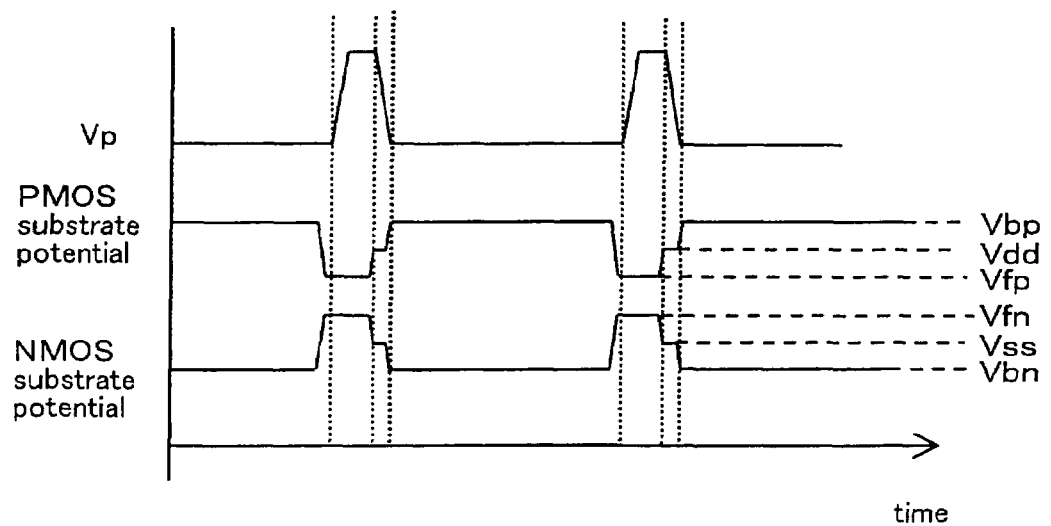
FIG. 6 is a waveform chart illustrating the case of implementing a substrate potential control by means of the latch according to the embodiment of the present invention.

FIG. 6 shows a waveform chart in the case of implementing the substrate potential control with respect to a transistor in a first stage of the latch 36. In the waveform chart, the substrate potential waveform of the PMOS transistor, and substrate potential waveform of the NMOS transistor, which are to be inputted to the latch, are shown. According to the case, when an input pulse waveform Vp rises, the forward bias voltage (Vfp and Vfn) is applied to both the PMOS transistor and NMOS transistor, thereby makeing it easy for both the transistors to be turned on, and enabling the operation at a higher speed.

When the input pulse waveform is low, the back bias voltage (Vbp and Vbn) is applied to both the PMOS transistor and NMOS transistor, which makes it difficult for both the transistors to be turned on, thereby reducing a leakage current flow and increasing the noise resistance.

Figure 7A:
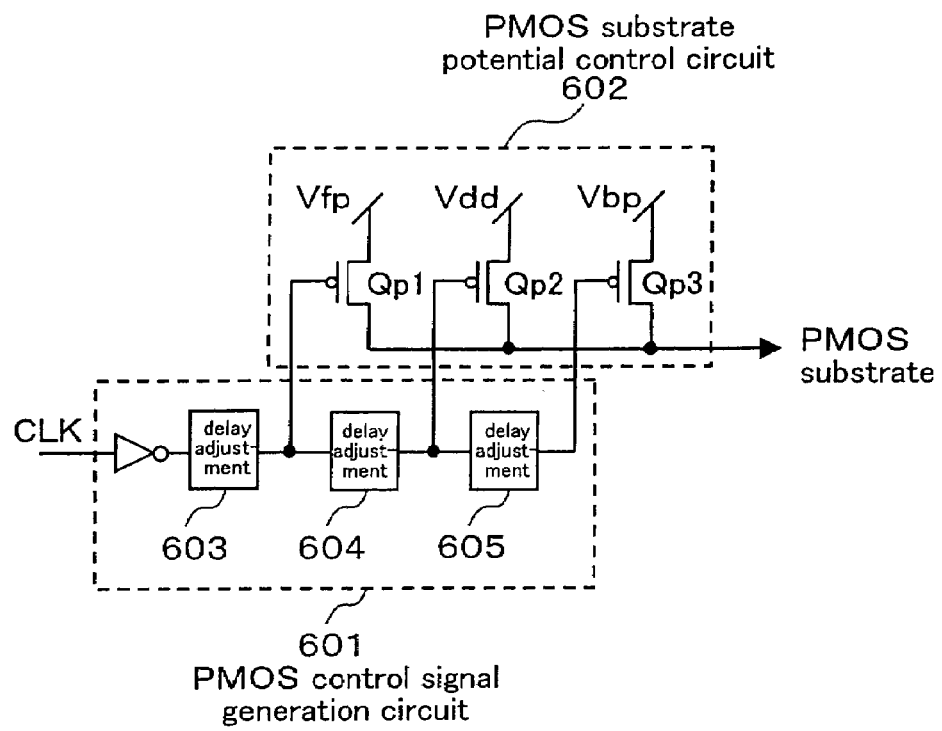
FIG. 7A is a circuit diagram illustrating specific circuit configurations of a PMOS control signal generation circuit and a PMOS substrate potential control circuit according to the embodiment of the present invention.
Figure 7B:
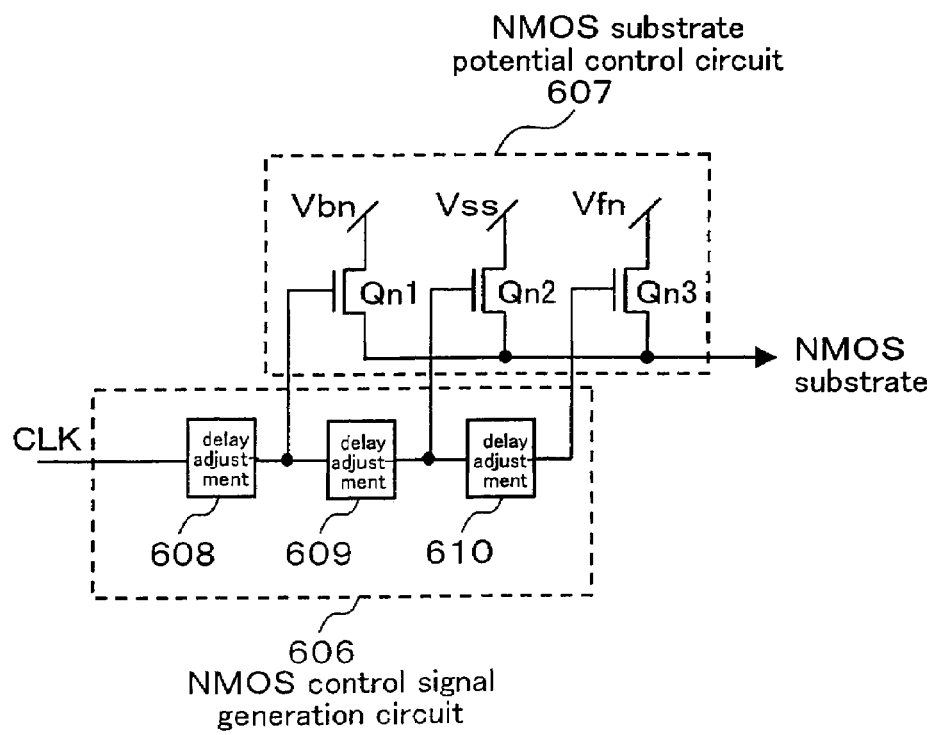
FIG. 7B is a circuit diagram illustrating specific circuit configurations of an NMOS control signal generation circuit and an NMOS substrate potential control circuit according to the embodiment of the present invention.

Next, FIG. 7A shows an example of the PMOS control signal generation circuit and PMOS substrate potential control circuit, which are suitable for the substrate potential control of FIG. 5. FIG. 7B shows an example of the NMOS control signal generation circuit and NMOS substrate potential control circuit, which are suitable for the substrate potential control of FIG. 5.

In FIG. 7A, a reference numeral 601 denotes a PMOS control signal generation circuit. A reference numeral 602 denotes a PMOS substrate potential control circuit. Reference numerals 603, 604, and 605 denote a delay adjustment circuit. The delay adjustment circuits, with regard to a transition time of the substrate potential, previously adjust delay values. An output terminal of the delay adjustment circuit 603 in a first stage is connected to a gate of a transistor Qp1 supplying the PMOS forward bias voltage Vfp. An output terminal of the delay adjustment circuit 604 in a second stage is connected to a gate of a transistor Qp2 supplying the normal potential Vdd. An output terminal of the delay adjustment circuit 605 in a third stage is connected to a gate of a transistor Qp3 supplying the back bias voltage Vbp.

When a clock signal CLK rises by means of the circuits shown in FIG. 7A, subsequent to the delay value from the delay adjustment circuit 603, the transistor Qp1 is turned on, and the forward bias voltage Vfp is supplied to the PMOS substrate. Next, subsequent to the delay value from the delay adjustment circuit 604, the transistor Qp2 is turned on, while the transistor Qp1 is turned off, and the normal potential Vdd is supplied to the PMOS substrate. Then, subsequent to the dealy value from the delay adjustment circuit 605, the transistor Qp3 is turned on, while the transistors Qp1 and Qp2 are turned off, and the back bias voltage Vbp is supplied to the PMOS substrate.

For reference, the foregoing arrangement can be realized in the case of the NMOS control signal generation circuit and NMOS substrate potential control circuit as well.

In FIG. 7B, a reference numeral 606 denotes an NMOS control signal generation circuit. A reference numeral 607 denotes an NMOS substrate potential control circuit. Reference numerals 608, 609, and 610 are a delay adjustment circuit. An output terminal of the delay adjustment circuit 608 in a first stage is connected to a gate of a transistor Qn1 supplying the NMOS back bias voltage Vbn. An output terminal of the delay adjustment circuit 609 in a second stage is connected to a gate of a transistor Qn2 supplying the normal potential Vss. An output terminal of the delay adjustment circuit 610 in a third stage is connected to a gate of a transistor Qn3 supplying the forward bias voltage Vfn.

When the clock signal CLK rises by means of the circuits shown in FIG. 7B, subsequent to the delay value from the delay adjustment circuit 608, the transistor Qn1 is turned on, and the back bias voltage Vbn is supplied to the NMOS substrate. Next, subsequent to the delay value from the delay adjustment circuit 609, the transistor Qn2 is turned on, while the transistor Qn1 is turned off, and the normal potential Vss is supplied to the NMOS substrate. Then, subsequent to the delay value from the delay adjustment circuit 610, the transistor Qn3 is turned on, while the transistors Qn1 and Qn2 are turned off, and the forward bias voltage Vfn is supplied to the NMOS substrate.

Figure 8:
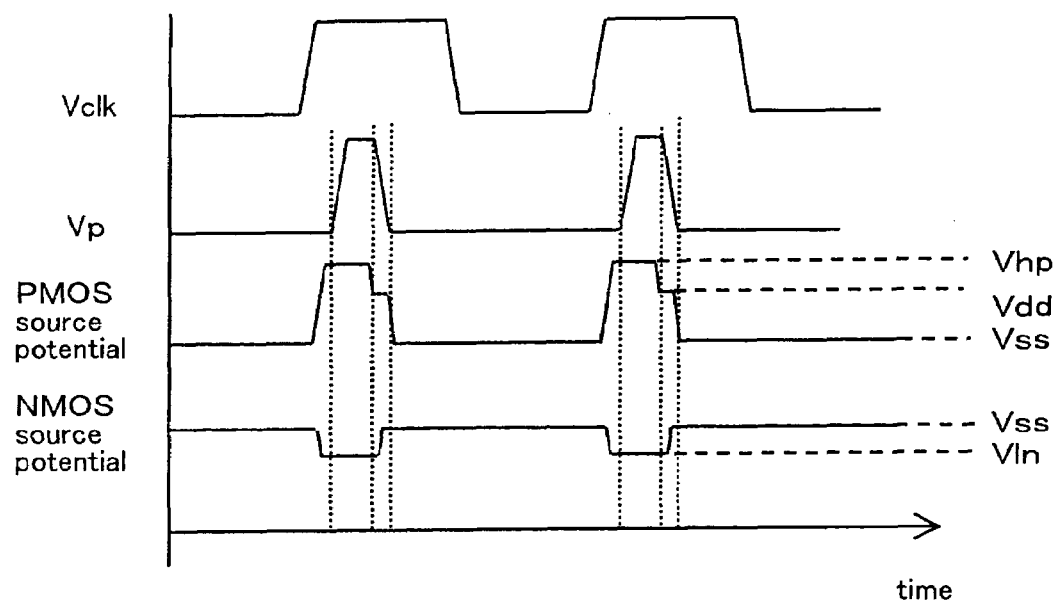
FIG. 8 is a waveform chart illustrating the case of implementing a source potential control by means of the pulse generator according to the embodiment of the present invention.

Next, an example of implementing the source potential control by means of the circuit shown in FIG. 4 is described. FIG. 8 shows a waveform chart in the case of controlling a source potential of the transistor linked to the final stage of the pulse generator 35, in which an example of the clock waveform, the output pulse waveform, a source potential waveform of the PMOS transistor, and a source potential waveform of the NMOS transistor are shown.

According to the example, when the pulse rises, the PMOS high voltage Vhp is supplied to the source potential of the PMOS transistor, and the NMOS low potential Vln is supplied to the source potential of the NMOS transistor. In this manner, the pulse can rise more promptly.

When the pulse falls, the PMOS normal potential Vdd is supplied to the source potential of the PMOS transistor, and the NMOS normal potential Vss is supplied to the source potential of the NMOS transistor. During the period when the pulse is low, the PMOS transistor is turned off, therefore the normal potential Vss is supplied to the source potential.

In this manner, the leakage current flow of the PMOS transistor can be controlled, and further, an influence from the noise can be reduced. The normal voltage Vss is supplied to the source potential of the NMOS transistor.

Figure 9:
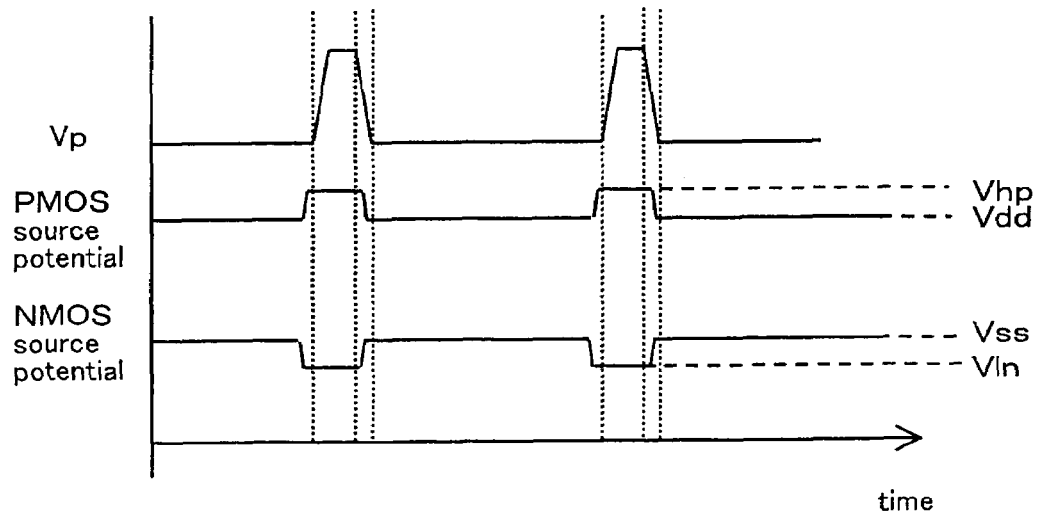
FIG. 9 is a waveform chart illustrating the case of implementing a source potential control by means of the latch according to the embodiment of the present invention.

FIG. 9 shows a waveform chart in the case of implementing the source potential control with respect to the transistor in the first stage of the latch 36 in the circuit shown in FIG. 4, in which an example of the input pulse waveform, source potential waveform of the PMOS transistor, source potential waveform of the NMOS transistor are shown.

When the pulse rises, the PMOS high potential Vhp is supplied to the source potential of the PMOS transistor, and the NMOS low potential Vln is supplied to the source potential of the NMOS transistor, thereby enabling the accelerated operation. From that onwards, the high-speed operation is no longer necessary, and therefore, the normal voltage is supplied to both the PMOS and NMOS transistors to thereby reduce the leakage current flow. In this manner, the latch circuit capable of the high-speed operation and low power consumption can be realized.

According to the present embodiment as described so far, the substrate potential and/or source potential is controlled based on the control signal generated inside the circuit as the controlled object. Therefore, a more flexible power control can be achieved according to the present invention compared to conventional technologies, wherein the standby and active modes of the entire circuit as the controlled object are switched over to each other based on a signal from outside of the semiconductor integrated circuit, or the gate voltage and substrate voltage are simply interfaced with each other. More specifically, although the entire circuit as the controlled object is in the active mode, the control can be implemented in such more flexible manner that the back bias voltage is applied to the turned-off MOS transistor in the circuit as the controlled object, and the forward bias voltage is applied to the turned-on MOS transistor in the circuit as the controlled object.

Further, according to the present embodiment, the following side effects are expected. In a CMOS circuit, when the MOS transistor is switched on/off, a through current, which is a current flow from the VDD to VSS via the PMOS transistor and NMOS transistor, is generated. According to the present embodiment, the absolute value of the threshold voltage of the turned-off transistor is set to be larger to thereby reduce the through current. As a result, the IR drop can be reduced, and a delay variability caused by the IR drop can be thereby reduced.

According to the present embodiment, the circuit as the controlled object employs the pulse generator circuit and latch circuit, however other circuits are applicable thereto.

In the circuit shown in FIG. 4, an inverter is connected to a pulse generator. In the case in which a plurality of pulse generators is connected to an inverter, the plurality of pulse generators is controlled by means of a substrate potential control circuit or a source potential control circuit to thereby further reduce the power consumption. In the semiconductor integrated circuit, the clock tree requires a large amount of power consumption. Therefore, when the substrate potential or source potential of the MOS transistor connected to the clock tree is controlled, the power consumption can be effectively reduced, while maintaining a delay.

When the circuit as the controlled object is not comprised of the clock tree, in view of information regarding allocation and wiring, the MOS transistors positioned in a neighborhood and logically operating in the same manner are controlled by a substrate potential control circuit or a source potential control circuit to thereby effectively reduce the power consumption in any circuit other than the clock tree.

The present invention is not limited to the foregoing embodiments, and various modifications within the scope of its technical idea can be implemented.

What is claimed is:

1. A semiconductor integrated circuit comprising:
   a circuit as a controlled object including a logic circuit and a plurality of MOS transistors, wherein an output of the logic circuit is input to a gate terminal of at least one MOS transistor of the plurality of MOS transistors and a substrate potential of the at least one MOS transistor is to be controlled;
   a control signal generation circuit for substrate potential generating a control signal to control the substrate potential based on an input signal of the logic circuit; and
   a substrate potential control circuit controlling the substrate potential of the at least one MOS transistor in the circuit as the controlled object based on the control signal;
   wherein the at least one MOS transistor includes a latch circuit for holding data, and
   wherein the latch circuit includes a clock input and holds data in synchronism with a clock signal input to the clock input.

2. The semiconductor integrated circuit as claimed in claim 1, wherein a substrate potential of the logic circuit is not controlled.

3. The semiconductor integrated circuit as claimed in claim 1, wherein the logic circuit includes a clock tree circuit for propagating a clock signal.

4. The semiconductor integrated circuit as claimed in claim 3, wherein the clock tree circuit includes a plurality of inverter circuits.

5. The semiconductor integrated circuit as claimed in claim 3, wherein a substrate potential of the clock tree circuit is not controlled.

6. The semiconductor integrated circuit as claimed in claim 3, wherein the plurality of MOS transistors further include a pulse generator circuit for producing a pulse signal based on the clock signal propagated by the clock tree circuit.

7. The semiconductor integrated circuit as claimed in claim 6, wherein the pulse signal generated by the pulse generator is input to the latch circuit.

8. The semiconductor integrated circuit as claimed in claim 7, wherein a substrate potential of the clock tree circuit is not controlled.

* * * * *